US010141155B2

(12) United States Patent
Delgado et al.

(10) Patent No.: US 10,141,155 B2
(45) Date of Patent: Nov. 27, 2018

(54) ELECTRON BEAM EMITTERS WITH RUTHENIUM COATING

(71) Applicant: KLA-Tencor Corporation, Milpitas, CA (US)

(72) Inventors: Gildardo R. Delgado, Livermore, CA (US); Edgardo Garcia Berrios, San Jose, CA (US); Frances Hill, Sunnyvale, CA (US); Rudy Garcia, Union City, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/588,006

(22) Filed: May 5, 2017

(65) Prior Publication Data

US 2018/0174794 A1 Jun. 21, 2018

Related U.S. Application Data

(60) Provisional application No. 62/436,925, filed on Dec. 20, 2016.

(51) Int. Cl.
*H01J 37/06* (2006.01)
*H01J 37/28* (2006.01)
(52) U.S. Cl.
CPC .............. *H01J 37/06* (2013.01); *H01J 37/28* (2013.01); *H01J 2237/061* (2013.01)
(58) Field of Classification Search
USPC ......................................................... 250/310
See application file for complete search history.

(56) References Cited

U.S. PATENT DOCUMENTS

| 5,363,021 | A | 11/1994 | MacDonald |
| 5,494,179 | A * | 2/1996 | Hori ...................... H01J 1/3042 216/11 |
| 7,074,719 | B2 * | 7/2006 | Kim ........................ C23C 16/18 257/E21.171 |
| 7,507,958 | B2 * | 3/2009 | Choi ....................... B82Y 15/00 250/306 |
| 7,508,216 | B2 * | 3/2009 | Wei ....................... G01N 27/005 313/311 |
| 9,812,333 | B2 * | 11/2017 | Kim .................... H01L 21/0337 |
| 2005/0092929 | A1 | 5/2005 | Schneiker |
| 2007/0164214 | A1 | 7/2007 | Choi et al. |
| 2008/0272299 | A1 | 11/2008 | Jin et al. |
| 2008/0287030 | A1 | 11/2008 | Dong-Wook et al. |
| 2014/0055025 | A1 | 2/2014 | Yasuda |
| 2018/0005791 | A1 | 1/2018 | Schultz et al. |

OTHER PUBLICATIONS

ISA/KR, International Search Report for PCT/US2017/066969 dated Apr. 16, 2018.

* cited by examiner

*Primary Examiner* — Phillip A Johnston
(74) *Attorney, Agent, or Firm* — Hodgson Russ LLP

(57) ABSTRACT

An emitter with a protective cap layer on an exterior surface of the emitter is disclosed. The emitter can have a diameter of 100 nm or less. The protective cap layer includes ruthenium. Ruthenium is resistant to oxidation and carbon growth. The protective cap layer also can have relatively low sputter yields to withstand erosion by ions. The emitter may be part of a system with an electron beam source. An electric field can be applied to the emitter and an electron beam can be generated from the emitter. The protective cap layer may be applied to the emitter by sputter deposition, atomic layer deposition (ALD), or ion sputtering.

20 Claims, 5 Drawing Sheets

ELECTRON BEAM EMITTERS WITH RUTHENIUM COATING

CROSS-REFERENCE TO RELATED APPLICATIONS

This application claims priority to the provisional patent application filed Dec. 20, 2016 and assigned U.S. App. No. 62/436,925, the disclosure of which is hereby incorporated by reference.

FIELD OF THE DISCLOSURE

This disclosure relates to electron emitters with a coating that includes ruthenium.

BACKGROUND OF THE DISCLOSURE

Emitters with small tip diameters (e.g., 100 nm or less) used for electron emission are affected by vacuum conditions. The vacuum conditions can deteriorate field emission performance. Typical electron emitters do not have protective coating to protect from oxidation or carbon build up. A carbon layer grows on the surface of the cathode tips during electron beam emission under ultra-high vacuum (UHV) conditions. Oxidation of surfaces in UHV environments is also likely. Previous designs also were not robust to cleaning of, for example, oxidation or carbon layers.

Silicon is a good candidate material for making nanotips to be used as electron emitters because of well-established silicon microfabrication techniques. However, silicon emitters are highly susceptibility to oxidation, which converts the emitter tip to a silicon oxide. The silicon oxide will render the tip inoperable for electron emission due to the high work function of the silicon oxide. Stability also is affected by presence of silicon oxide on the emitter. There is no clear method to prevent this from occurring over the system lifetime.

Therefore, what is needed is an improved electron emitter.

BRIEF SUMMARY OF THE DISCLOSURE

In a first embodiment, an apparatus is provided. The apparatus comprises an emitter and a protective cap layer disposed on an exterior surface of the emitter. The emitter has a diameter of 100 nm or less. The protective cap layer includes ruthenium.

The emitter can have an emitting area of less than 1 mm$^2$.

The protective cap layer can have a thickness from 1 nm to 100 nm. For example, the protective cap layer may have a thickness from 1 nm to 20 nm. In this example, the emitter may have a tip radius from 1 nm to 50 nm.

The protective cap layer can be free of pinholes, bubbles, or inclusions in at least an emitting area. The protective cap layer may only have imperfections with a diameter or length dimension less than 1 nm. The protective cap layer can have fewer than $10^4$ impurities. The impurities can include carbon, oxides, oxygen as a dissolved gas, sodium, or potassium. The protective cap layer can have a porosity less than or equal to 25%. The protective cap layer can have a packing density of greater than or equal to 0.92.

In a second embodiment, a method is provided. In the method, an emitter having an exterior surface is provided. The emitter has a diameter of 100 nm or less. A protective cap layer is applied to the exterior surface of the emitter. The protective cap layer includes ruthenium. The applying can include sputter deposition, atomic layer deposition, or ion sputtering.

In a third embodiment, a method is provided. In the method, an emitter that includes a protective cap layer disposed on an exterior surface of the emitter is provided. The emitter has a diameter of 100 nm or less. The protective cap layer includes ruthenium. An electric field is applied to the emitter. An electron beam is generated from the emitter. The emitter can operate in a vacuum of $10^{-9}$ Torr or less.

In a fourth embodiment, a system is provided. The system comprises an electron beam source; an emitter in the electron beam source; a protective cap layer disposed on an exterior surface of the emitter; and a detector. The emitter has a diameter of 100 nm or less. The protective cap layer includes ruthenium. The protective cap layer can be free of pinholes in at least an emitting area.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The embodiments disclosed herein provide an emitter with high electron current stability and lifetime. As disclosed herein, the tip of the emitter is coated with a protective cap layer of ruthenium. Ruthenium is resistant to oxidation and carbon growth. The protective cap layer also can have relatively low sputter yields to withstand erosion by ions. The embodiments disclosed herein can be retrofitted into existing systems, which reduces redesign costs.

Figure 1:
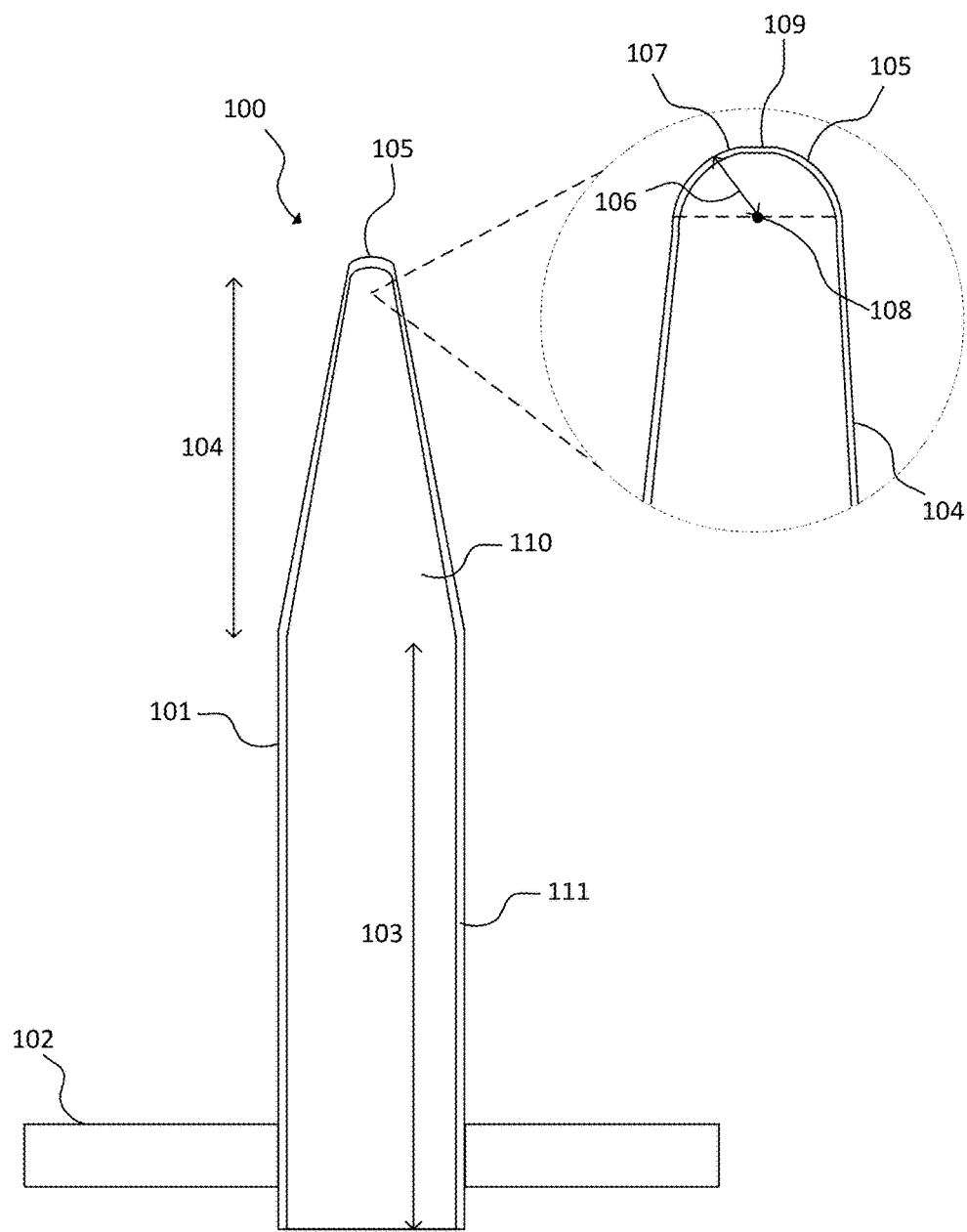
FIG. 1 is a front view of an embodiment of an electron emittance system in accordance with the present disclosure.

FIG. 1 is a front view of an electron emittance system 100, which includes an emitter 101 and emitter mounting mechanism 102. The electron emittance system 100 is configured to emit electrons into the environment or space around the electron emittance system 100. The emitter 101 has a first section 103, a second section 104, and a rounded tip 105. The first section 103 can be cylindrical. Without the rounded tip 105, the second section 104 can be generally frustoconical. The second section 104 can be disposed on a distal end of a first section 103. The second section 104 can have a tapering width or diameter between the first section 103 and the rounded tip 105. While the first section 104 and second section 105 can be generally round, both the first section 104 and second section 105 may be faceted due to the crystal structure. The rounded tip 105, which is disposed on a distal end of the second section 104, may generally be a truncated sphere. The rounded tip 105 can be at least partly or fully rounded. Other shapes than those described herein are possible.

The first section 103 or the first section 103 and second section 104 can be described as the "shaft" of the emitter 101. The shaft of the emitter 101 is held by the emitter mounting mechanism 102.

The dimensions of the emitter 101, first section 103, second section 104, or rounded tip 105 can vary. The shaft of the emitter 101 or the emitter 101 itself can be on the nanometer scale or the micron scale with respect to both length and diameter.

The emitter 101 includes an emitter core 110 and a protective cap layer 111. The protective cap layer 111 is disposed on the outer surface of the emitter core 110. An entirety or less than an entirety of the outer surface of the emitter core 110 may be covered by the protective cap layer 111. Thus, 100% or less than 100% of the exposed surface of the emitter 101 may be covered by the protective cap layer 111. However, at least the rounded tip 105 of the emitter 101 or at least the emitting area of the emitter 101 may be covered by the protective cap layer 111.

The emitter core 110 may be silicon or other materials. The protective cap layer 111 can be ruthenium or an alloy that includes ruthenium. ($Ru_x Pt_y$), where $x+y=1$, is an example of a ruthenium alloy that can be used as the protective cap layer 111. Other ruthenium alloys are possible.

The configuration of the emitter mounting mechanism 102 can vary from that illustrated in FIG. 1. In an example, an emitter mounting mechanism 102 supports the emitter tip using a tungsten hairpin seated on a ceramic insulator with electrodes for the hairpin legs. The hairpin can be heated to either provide flash cleaning or to raise the emitter temperature to thermal field emission (TFE) values (e.g., approximately 1,800 K). A ground-referenced power supply can provide the bias voltage for the emitter, which may be approximately 5 KV.

An electric field is applied to or otherwise in the electron emittance system 100. The electric field can be applied using charged plates or using other techniques.

The rounded tip 105 is configured to emit free electrons into an evacuated space around the electron emittance system 100. Electrons can be generated by applying an electric field to the electron emittance system 100.

As seen in the inset of FIG. 1, the rounded tip 105 has a radius 106. The radius 106 can be measured from a center 108 of the rounded tip 105 in the emitter core 110 to an outer surface 107 of the protective cap layer 111. The rounded tip 105 can have a radius 106 less than 1 µm, including all values to the 1.0 nm and ranges between. For example, the rounded tip 105 can have a radius 106 of 700 nm or less, 450 nm or less, or 100 nm or less. The radius is greater than 0 µm.

The emitter 101 can have an emitting area less than 1 µm². This emitting area may be part of the outer surface 107 of the rounded tip 105.

The rounded tip 105 may be uniformly rounded or non-uniformly rounded. The rounded tip 105 may include a flat emitting facet 109. For example, there may be a flat emitting facet 109 in the form of a small <100> orientation nano-flat. This flat emitting facet 109 can be used to generate a well-collimated electron beam. In an example, the flat emitting facet 109 can provide an emitting area less than 1 µm².

In other examples, the rounded tip 105 has a generally hemispherical or paraboloidal shape. These shapes may disperse electron emission more broadly, which can result in a smaller, brighter fraction of electrons that pass into the electron optics.

To provide the desired rounded tip 105, surface crystallinity may be controlled.

The protective cap layer 111 can render the emitter 101 resistant to oxidation and carbon build up. The protective cap layer 111 also can have relatively low sputter yields to withstand erosion by ions.

The protective cap layer 111 can have a thickness from 1 nm to 100 nm, including all values to the 0.1 nm and ranges between. For example, the protective cap layer 111 can have a thickness from approximately 1 nm to 20 nm, including all values to the 0.1 nm and ranges between. For example, the thickness of the protective cap layer 111 may be from approximately 1 nm to 5 nm. The thickness of the protective cap layer 111 may be designed to optimize electron emission. The exact thickness can depend on the initial tip radius of the emitter 101. Thus, the thickness of the protective cap layer 111 can be greater than 20 nm.

Diameter at the outer surface of the protective cap layer 111 may be controlled to tune the properties of the electron beam (e.g., brightness, electric field at the tip, current-voltage properties, electron-electron interactions). The diameter at the outer surface of the protective cap layer 111 is made up of the sum of the diameter of the emitter core 110 plus the thickness of the protective cap layer 111 on both sides of a cross-section of the emitter 101. When selecting the diameter of the emitter core 110, there are fabrication issues to consider such as ease of fabrication, repeatability, and variability of dimensions between emitters. When selecting the thickness of the protective cap layer 111, the quality of the film, such as the grain structure, grain boundaries, discontinuities, surface coverable, pinholes, film density, or surface roughness, may be controlled. It may be important that the protective cap layer 111 coating the emitter be uniform, dense, continuous, and have very low surface roughness, particularly at the tip. To take care of electric field penetration, the lower bound of the protective cap layer 111 thickness may be one monolayer. Above one monolayer, the film thickness can be chosen to optimize the film quality. The total diameter of the emitter core 110 plus the protective cap layer 111 can be chosen to optimize the electron beam properties.

In an example, the emitter 101 has a radius 106 from 1 nm to 50 nm to an outer surface of the protective cap layer 111. The protective cap layer 111 has a thickness from 1 nm to 20 nm.

Reducing the diameter of the rounded tip 105 or otherwise changing the radius of the rounded tip 105 increases the brightness of the emitted beam. The reduced brightness $B_r$ of an emitter is defined as:

$$B_r = \frac{I}{\pi r_{vs}^2 \Omega V_{ext}} \qquad \text{Eq. 1}$$

where I is the field emission current, $r_{vs}$ is the radius of the virtual source, $\Omega$ is the solid angle of the beam, and $V_{ext}$ is the operating voltage. Two parameters in the equation for brightness change when the tip diameter is reduced. First, smaller tips have higher enhancement of the electric field at the tip, so the voltage required to emit a given current decreases and the value of $V_{ext}$ is reduced, leading to a higher value for reduced $B_r$. Second, small tip diameters have lower virtual source size $r_{vs}$, resulting in a higher value of reduced $B_r$.

Brightness typically increases as the radius decreases because electrons are emitted from a smaller surface area. The dimensions of the emitter core 110 and the thickness of the protective cap layer 111 can be configured to provide the desired brightness.

Virtual source size (VSS) of the emitter 101 also can affect brightness. A smaller VSS may result in higher brightness. Changing the radius 106 of the emitter 101 and/or the thickness of the protective cap layer 111 can affect the VSS and, consequently, the brightness. This also may affect total current density and/or total current emission.

The emitting area of the rounded tip 105 can be less than 1 mm². The emitting area of the rounded tip 105 can correspond to the entire surface area of the rounded tip 105 or just part of the surface area of the rounded tip 105. For example, the emitting area may correspond to a flat emitting facet 109.

The brightness of an emitter scales inversely with the work function of the material. The reduced brightness of an emitter material is defined in Equation 1. The field emission current I is inversely proportional to the work function of the material. Lower values of work function yield higher current and, thus, higher brightness values. The virtual source size $r_{vs}$ is inversely proportional to the work function elevated to ¼, so virtual source size increases with lower work function, but the increase in the current dominates resulting in a net higher brightness for low work functions.

All or part of the protective cap layer 111 can be free of pinholes. For example, at least the emitting area of the emitter 101 may be free of pinholes. The emitting area may be the 5-10 nm region near the tip or other areas. The effect of any pinholes can be magnified by the high extraction fields necessary to pull the electron beam.

All or part of the protective cap layer 111 can be free of bubbles or inclusions. For example, at least the emitting area of the emitter 101 may be free of bubbles or inclusions.

A maximum imperfection diameter or length dimension in the protective cap layer 111 may be less than 1 nm. Imperfections include excessive structure in the deposited film, such as rods or lumps that can be controlled via sputtering parameters.

Homogeneity of the protective cap layer 111 may be controlled. Many emitters are crystal structures, such as the 100 tungsten crystal used in field emitter tips. In an instance, there is crystal structure in the substrate silicon, but this is not necessarily translated to a surface crystallinity because process such as sputter coating produce an amorphous film. Since the emitter is a region is on the order of nanometers, the crystallinity is on the order of 5 nm to 10 nm regions at the tip. Deposition processes such as atomic layer deposition (ALD) can project the crystal structure to the deposited film. Homogeneity can be evaluated with a cross section using a focused ion beam (FIB) and examination with transmission electron microscopy (TEM). Homogeneity also can be evaluated by examining film properties using ellipsometry techniques. The protective cap layer 111 at the apex of the emitter 101 may be configured to be extremely sharp.

The protective cap layer 111 can have fewer than $10^3$ or $10^4$ impurities. Impurities can include carbon, oxides, oxygen as a dissolved gas, sodium, potassium, or other materials. Impurities affect the work function of the protective cap layer 111, which will affect uniformity of the electron emission.

Porosity of the protective cap layer 111 may be less than or equal to 25%. Packing density of the protective cap layer 111 may be greater than or equal to 0.92. Porosity (P) can be defined and measured using index of refraction with the following equation $$P(\%) = \left(1 - \left(\frac{n_f^2}{n_B^2} - 1\right)\right) * 100\% \qquad \text{Eq. 2}$$

wherein where of is the refractive index of deposited thin film and $n_B$ is the refractive index of the bulk material.

Packing density (PD) of a film is defined as a ratio of the average film density ($\rho_f$) and the bulk density ($\rho_B$) using the following equation.

$$PD = \rho_f/\rho_B \qquad \text{Eq. 3}$$

The correlation between the film refractive index and its packing density can be expressed by the following equation.

$$PD = \left(\left(\frac{n_f^2-1}{n_f^2+2} - \frac{n_B^2+2}{n_B^2-1}\right)\right) * 100\% \qquad \text{Eq. 4}$$

The protective cap layer 111 provides advantages over using the emitter core 110 without the protective cap layer 111. The protective cap layer 111 provides higher electron current and higher current stability. For example, an emitter 101 with a protective cap layer 111 will produce higher emission current and have better emission current stability compared to n-type silicon or p-type silicon emitters without a protective cap layer 111. Higher emission current can be achieved because the protective cap layer 111 includes a metal. Higher emission currents lead to higher beam brightness.

Furthermore, the protective cap layer 111 reduces carbon contamination and oxidation. Ruthenium or ruthenium alloys can be cleaned by molecular hydrogen, hydrogen plasmas, or other plasmas. Thus, any carbon contamination or oxidation on the protective cap layer 111 can be removed using, for example, $H_2^+$ with heat and/or oxygen.

A protective cap layer 111 that includes ruthenium is robust for electron field emission or in the presence of high electric fields. Such a protective cap layer 111 also is robust to ion sputtering and cleaning.

Ruthenium may have the ability to break apart gas molecules that land on its surface or prevent adherence of such gas molecules to its surface. These molecules are capable of distorting the extraction field on the surface of the emitter and causing enhanced emission which translates as noise in the beam because of the mobility and residence time of the molecule on the surface. Thus, the protective cap layer 111 can be self-cleaning.

The protective cap layer can be formed on an exterior surface of an emitter. The emitter may have a diameter of 100 nm or less. The protective cap layer, which includes ruthenium, is applied to the exterior surface of the emitter.

The protective cap layer 111 can be deposited by ion or magnetron sputtering, ALD, or by other methods known to those skilled in the art. These techniques can enable formation of a protective cap layer 111 with the desired density and uniformity.

Figure 3:
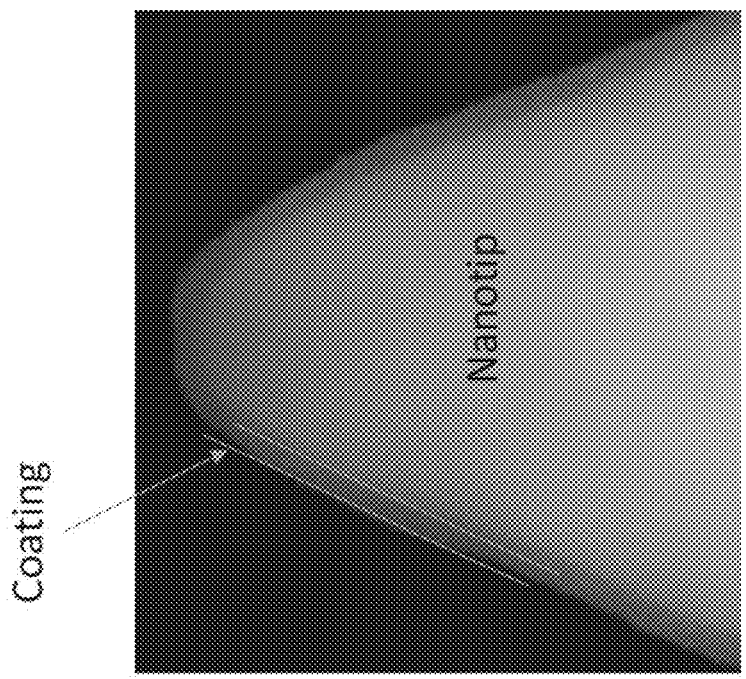
FIG. 3 is a cross-sectional view of the electron emittance system of FIG. 2.
Figure 2:
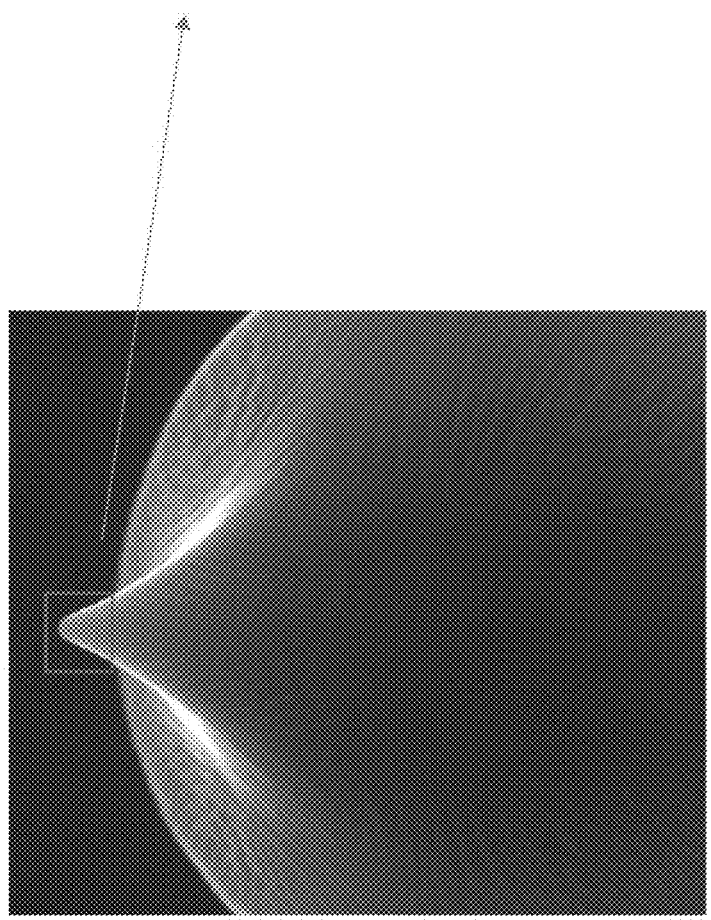
FIG. 2 is a view of a prototype of an electron emittance system in accordance with the present disclosure.

FIG. 2 is a view of a prototype of an electron emittance system. FIG. 3 is a cross-sectional view of the electron emittance system of FIG. 2. The overall shape of the emitter can be conical or pencil-shaped, for example. The shape of the emitter may be chosen to provide the required amount of field enhancement for the extractor geometry, and the shape of the emitter also can set the required extraction voltage. In general, higher field enhancement may be better because it requires lower operating voltages (e.g., less chance of arcing, higher reduced brightness in the electron beam, low energies of backstreaming ions, etc.). The emitters could be mounted to a heater filament, could be etched on a planar emitter chip, or could be used in another configuration.

Emitter lifetime can be improved by using the protective cap layer 111 that includes ruthenium. In an example, an emitter with a protective cap layer 111 that includes ruthenium can operate in $10^{-9}$ Torr vacuum conditions for months or even a year or more. Without the protective cap layer 111, $10^{-12}$ Torr vacuum conditions may be needed to prevent oxides from negatively affecting emitter 101 performance.

Based on modeling, an emitter 101 with a protective cap layer 111 that includes ruthenium can provide 100× to 1000× brightness compared to existing emitter designs.

Figure 4:
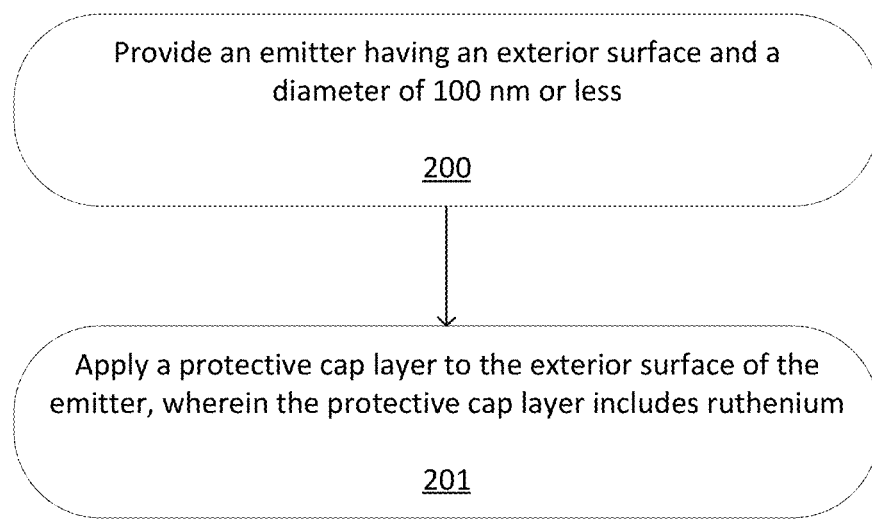
FIG. 4 is a flowchart of a method in accordance with the present disclosure.

FIG. 4 is a flowchart of a method in accordance with the present disclosure. At 200, an emitter having an exterior surface is provided. The emitter has a diameter of 100 nm or less. At 201, a protective cap layer is applied to the exterior surface of the emitter. The protective cap layer includes ruthenium, and may be an alloy that includes ruthenium. The applying can include sputter deposition, ALD, or ion sputtering. Sputter deposition and ALD can provide desired conformality of the protective cap layer. In particular, sputter deposition may reduce porosity, the presence of voids, and the presence of pinholes in the protective cap layer.

Figure 5:
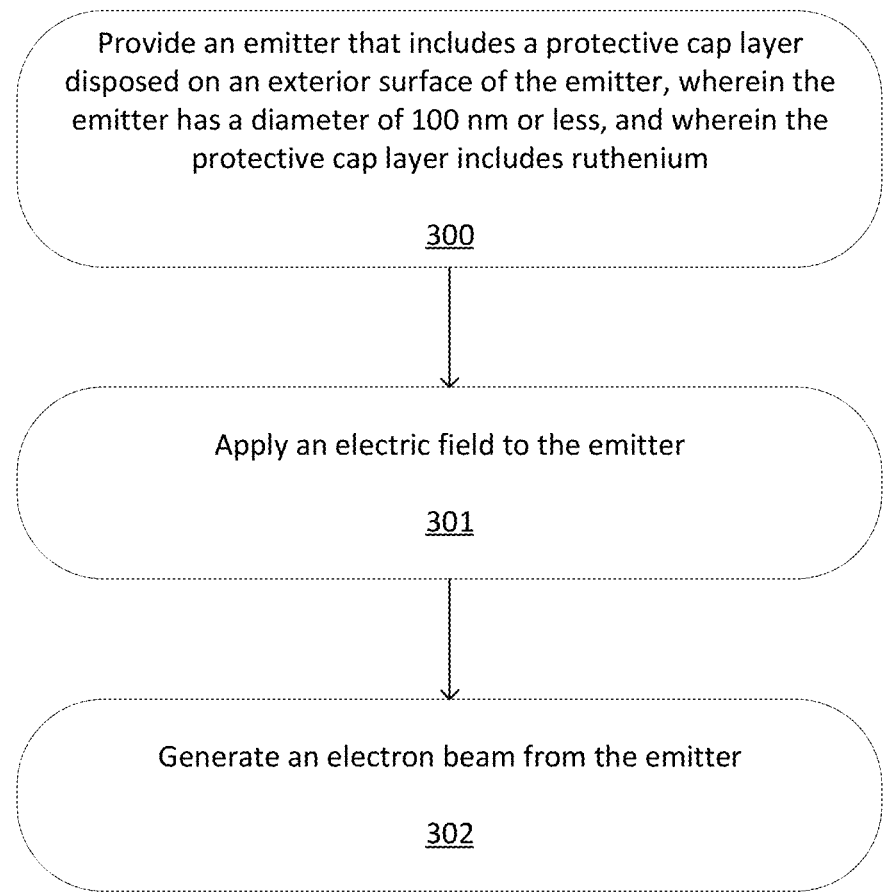
FIG. 5 is a flowchart of another method in accordance with the present disclosure.

FIG. 5 is a flowchart of another method in accordance with the present disclosure. At 300, an emitter that includes a protective cap layer disposed on an exterior surface of the emitter is provided. The emitter has a diameter of 100 nm or less. The protective cap layer includes ruthenium, and may be an alloy that includes ruthenium. At 301, an electric field is applied to the emitter. At 302, an electron beam is generated from the emitter. The emitter may operate in a vacuum of $10^{-9}$ Torr.

An extraction voltage from approximately 0.5 kV to 10 kV may be used during electron beam generation, including all ranges and values to the 0.1 kV between. For example, the extraction voltage may be from approximately 1 kV to 10 kV or from approximately 1.5 kV to 10 kV. Other extraction voltages are possible.

An electric field for an emitter with a protective cap layer can range from approximately 0.1 V/nm to 5 V/nm, including all ranges and values to the 0.1 V/nm between. The electric field can vary depending on the outer diameter of the emitter (including the thickness of the protective cap layer). Electric fields greater than 5 V/nm can be used for high currents (e.g., greater than 10 µA).

Embodiments of this disclosure can be used in reticle and wafer inspection and metrology systems. The systems can be configured to provide the desired vacuum environment specifications. Examples of these systems include electron beam wafer or reticle inspection systems using single or multiple electron sources; electron beam wafer or reticle review systems using single or multiple electron sources; electron beam wafer or reticle metrology systems using single or multiple electron sources; or systems which require at least one electron source for generation of x-rays using single or multiple electron beams for use in wafer or reticle metrology, review, or inspection. The electron stream from the emitter can be directed toward a sample, such as a semiconductor wafer or other workpiece. The electron stream may travel through extraction and focusing electrodes to form an electron beam with a desired beam energy and beam current. One or more lenses can be used to create a small electron beam spot on the sample. Deflectors can be used to scan the electron beam. The sample can be placed on a stage, which may be capable of scanning relative to the electron beam. Secondary electrons and back-scattered electrons can be emitted from the sample when the electron beam hits the sample, which can be collected and accelerated toward a detector.

Figure 6:
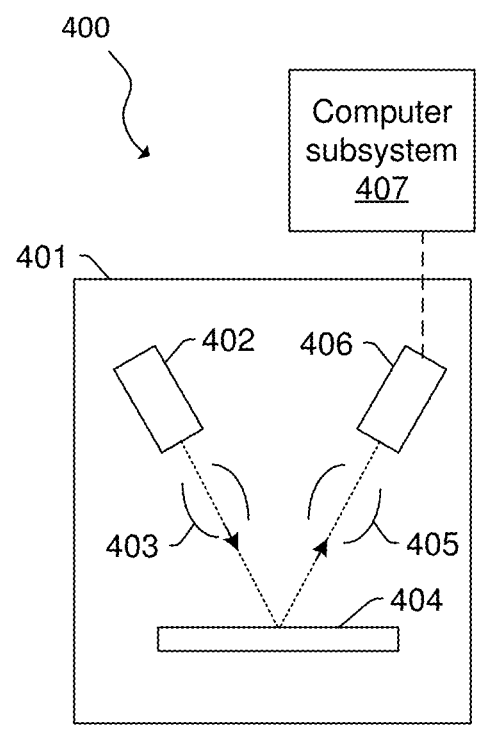
FIG. 6 is an embodiment of a system in accordance with the present disclosure.

The embodiments described herein may include or be performed in a system, such as the system 400 of FIG. 6. The system 400 includes an output acquisition subsystem that includes at least an energy source and a detector. The output acquisition subsystem may be an electron beam-based output acquisition subsystem. For example, in one embodiment, the energy directed to the wafer 404 includes electrons, and the energy detected from the wafer 404 includes electrons. In this manner, the energy source may be an electron beam source 402. In one such embodiment shown in FIG. 6, the output acquisition subsystem includes electron column 401, which is coupled to computer subsystem 407.

As also shown in FIG. 6, the electron column 401 includes electron beam source 402 configured to generate electrons that are focused to wafer 404 by one or more elements 403. The electron beam source 402 may include an emitter, such as the emitter 101 of the electron emittance system 100 in FIG. 1, and one or more elements 403 may include, for example, a gun lens, an anode, a beam limiting aperture, a gate valve, a beam current selection aperture, an objective lens, and/or a scanning subsystem. The electron column 401 may include any other suitable elements known in the art. While only one electron beam source 402 is illustrated, the system 400 may include multiple electron beam sources 402.

Electrons returned from the wafer 404 (e.g., secondary electrons) may be focused by one or more elements 405 to detector 406. One or more elements 405 may include, for example, a scanning subsystem, which may be the same scanning subsystem included in element(s) 403. The electron column 401 may include any other suitable elements known in the art.

Although the electron column 401 is shown in FIG. 6 as being configured such that the electrons are directed to the wafer 404 at an oblique angle of incidence and are scattered from the wafer at another oblique angle, it is to be understood that the electron beam may be directed to and scattered from the wafer at any suitable angle. In addition, the electron beam-based output acquisition subsystem may be configured to use multiple modes to generate images of the wafer 404 (e.g., with different illumination angles, collection angles, etc.). The multiple modes of the electron beam-based output acquisition subsystem may be different in any image generation parameters of the output acquisition subsystem.

Computer subsystem 407 may be in electronic communication with the detector 406. The detector 406 may detect electrons returned from the surface of the wafer 404 thereby forming electron beam images of the wafer 404. The electron beam images may include any suitable electron beam images. Computer subsystem 407 may be configured to perform other functions or additional steps using the output of the detector 406 and/or the electron beam images.

It is noted that FIG. 6 is provided herein to generally illustrate a configuration of an electron beam-based output acquisition subsystem. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system).

In one embodiment, the system 400 is an inspection system. For example, the electron beam output acquisition subsystems described herein may be configured as inspection systems. In another embodiment, the system 400 is a defect review system. For example, the electron beam output acquisition subsystems described herein may be configured as defect review systems. In a further embodiment, the system 400 is a metrology system. For example, the electron beam output acquisition subsystems described herein may be configured as metrology systems. In particular, the embodiments of the system 400 described herein and shown in FIG. 6 may be modified in one or more parameters to provide different imaging capability depending on the application for which they will be used. In one such example, the system 400 shown in FIG. 6 may be configured to have a higher resolution if it is to be used for defect review or metrology rather than for inspection. In other words, the embodiment of the system 400 shown in FIG. 6 describe some general and various configurations for an system 400 that can be tailored in a number of manners to produce output acquisition subsystems having different imaging capabilities that are more or less suitable for different applications.

Embodiments of the system 400 or electron emittance system 100 may be configured for inspection, defect review, and/or metrology of specimens such as wafers and reticles. For example, the embodiments described herein may be configured for using both scanning electron microscopy (SEM) for the purposes of mask inspection, reticle inspection, reticle metrology, wafer inspection, and wafer metrology. The system 400 or electron emittance system 100 also can be configured as electron sources for the generation of x-rays for wafer or reticle metrology, review, or inspection.

In particular, the embodiments described herein may be installed on a computer node or computer cluster that is a component of or coupled to an output acquisition subsystem such as an electron beam inspector or defect review tool, a mask inspector, a virtual inspector, or other devices. In this manner, the embodiments described herein may generate output that can be used for a variety of applications that include, but are not limited to, wafer inspection, mask inspection, electron beam inspection and review, metrology, or other applications. The characteristics of the system 400 shown in FIG. 6 can be modified as described above based on the specimen for which it will generate output.

The emitters disclosed herein can be configured to operate in different modes including cryogenic field emission mode, room temperature field emission mode, warm temperature field emission mode, thermal field mode, or photocathode mode. Combinations of these modes also may be performed using the emitters disclosed herein. The emitter may be optimized for a particular mode or the parameters used in each particular mode can be tailored to the emitter. For example, the dimensions of the rounded tip may vary for each mode.

In a field emission mode, an electric field is applied to or in the electron emittance system, such as using an electrode with high positive voltage. The high positive voltage attracts electrons, which causes some electrons to leave the surface of the emitter. Electrons will tunnel through the surface barrier and travel toward a biased anode when the applied electric field is high enough to reduce the potential barrier on the rounded tip-vacuum interface (i.e., quantum-mechanical tunneling).

Operating temperatures for cryogenic field emission mode may be from approximately 0 K to less than 300 K. The temperature of the system is less than or equal to the temperature of the emitter during operation. Cryogenic field emission is expected to reduce the energy distribution of the emitted electrons. Energy spread ($\Delta E$) can be decreased by narrowing Fermi-Dirac distribution at the emitter. Cryogenic field emission mode may include periodic flashing of temperature to keep emission stable.

Room temperature field emission generally operates at 65° F. to 100° F. (18° C. to 38° C.). The room temperature field emission operation mode may require no hardware for cooling, unlike cryogenic field emission, and, thus, can have a lower implementation cost.

The warm temperature field emission mode operates at a temperature greater than ambient and below 1000 K or at a temperature greater than ambient and below the temperature at which thermionic emission is detectable in the system. The emitter temperature is between the temperature of the system and the temperature at which thermionic emission is detectable in the system. Warm temperature field emission mode can provide decreased current fluctuation due to a higher number of electrons in the conduction band, which reduces electron-hole interactions in the bulk, and/or smaller residence time of impinging molecules at the emitter tip. Warm field emission benefits from reducing the binding energy of undesired impinging molecules (e.g., $H_2O$, $H_2$, CO, $CO_2$, $O_2$, $N_2$, or hydrocarbons), thus reducing their residence time on the emitter surface.

The thermal field emission mode may use a lower extraction voltage to achieve the same brightness as, for example, room temperature field emission mode. The emitter temperature in thermal field emission mode can be approximately 1,800 K. The thermal field emission makes more energetic electrons available for emission, but at the cost of increased energy spread because of the added thermal energy spectrum. One advantage of the thermal field emission mode is that the residence time of adsorbates can be significantly reduced, and, thus, high frequency noise in the beam current is reduced. The electron optics can be configured to reduce energy spread.

In photocathode mode, light of a certain frequency falls upon the emitter. Photoelectric emission occurs to generate the stream of electrons. Thus, a photon is absorbed, an electron moves to the surface of the emitter, and the electrons escape to vacuum. This can be performed in conjunction with or separate from another field emission mode.

Some reticle and wafer inspection applications need an electron source with the highest possible reduced brightness $B_r$ (brightness normalized with beam energy) and lowest possible energy spread ($\Delta E$) with stabilities of less than 1% during entire inspection time. High frequency current fluctuation of a field emitter can originate from the constant adsorption/desorption of the residual gas molecules in the vacuum. The root-mean-square noise is inversely proportional to a power of 1.5 of the emission surface area. As the tip radius becomes smaller, higher noise under the same vacuum conditions can occur. Lower vacuum can reduce noise. Heating the rounded tip to a temperature (e.g., from approximately 380 K to 1,000 K) during the emission to remove volatile species and prevent volatile species from remaining on the surface (reduce molecule residence time) and to maintain a clean emission surface also can provide stable emission. Heating the emitter also reduces the tunneling distance and increases electron energy, making it easier to field emit. However, heating up the emitters can cause the energy to broaden or can cause a larger energy spread.

A combined photocathode and field emission mode can enable the following process to occur. A photon is absorbed, electrons populate a conduction band, and electrons move to the surface. Heat is applied to the emitter and electrons escape to vacuum with an applied electric field. Photon energy should typically be high enough to excite electron to the conduction band but lower than ionization energy. Laser penetration depth may need to be considered when optimizing laser delivery.

The optimal total pressure for operation of emitters for cryogenic field emission, room temperature field emission, warm temperature field emission, or photocathode mode may be $10^{-9}$ Torr or less. This operating pressure sums all of the partial pressures of vacuum relevant molecules (e.g., $H_2O$, $H_2$, $CO$, $CO_2$, $O_2$, $N_2$, or hydrocarbons). For $H_2$, the partial pressure limit may be $10^{-12}$ Torr, whereas for any other molecules, the partial pressure may be below $10^{-10}$ Torr.

The operating pressure may vary with operation mode. For example, operating pressure may vary with emission mechanism and surface activation energy. Thermal field emission mode may operate at $10^{-9}$ Torr or below. Cryogenic field emission mode may operate at $10^{-10}$ Torr or less. Cryogenic field emission mode also may operate at $10^{-11}$ Torr or less.

In thermal field emission, the added thermal energy can desorb contamination more easily, so there may be a decreased sensitivity to pressure. If the binding energy for adsorbates is high, then a low pressure is used to reduce the impingement rate of adsorbates.

In photocathodes, the added energy from the illumination source may provide the ability to desorb any surface contaminants, but this can depends on the surface activation energies of the materials used.

The operating pressure or other vacuum parameters affect contamination or erosion of the emitter. High particle count for the environments around the emitter, such as those caused by moisture or other particles, can result in accelerated mass loss. Work-function emitting areas can disappear and emission can fall off to near zero because only high work function surfaces are exposed to the extracting field. Any pitting of the emitting material can be crystallographically-disrupted, which affects work function.

For example, carbon contamination of emitting surfaces, especially at lower operating temperatures, can occur when a thin layer of carbon forms on the electron stream emitting surface. Carbon contaminants can be caused by volatile vacuum system related organics (e.g., oils or lubricants), residue from polishes or cleaners, residual fibers from cotton swabs or cleaning cloths, or other sources. The carbon film poisons the emitting surface with a high work function layer, which results in reduced emitted current.

In another example, oxidation, sublimation, or evaporation of material from the emitter can occur due to moisture. Consequently, refractory or dielectric material can form on other surfaces, including internal surfaces, apertures, and anode surfaces.

To avoid carbon contamination, moisture damage, or oxidation, the vacuum environment around the electron emittance system is controlled. The operating pressure of the environment can depend on the operating mode.

Each of the steps of the method may be performed as described herein. The methods also may include any other step(s) that can be performed by the controller and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An apparatus comprising:
   a silicon emitter, wherein the silicon emitter has a diameter of 100 nm or less; and
   a protective cap layer disposed on an exterior surface of the silicon emitter, wherein the protective cap layer includes ruthenium.

2. The apparatus of claim 1, wherein the silicon emitter has an emitting area of less than 1 $mm^2$.

3. The apparatus of claim 1, wherein the protective cap layer has a thickness from 1 nm to 100 nm.

4. The apparatus of claim 3, wherein the protective cap layer has a thickness from 1 nm to 20 nm.

5. The apparatus of claim 4, wherein the silicon emitter has a tip radius from 1 nm to 50 nm.

6. The apparatus of claim 1, wherein the protective cap layer is free of pinholes in at least an emitting area.

7. The apparatus of claim 1, wherein the protective cap layer is free of bubbles and inclusions in at least an emitting area.

8. The apparatus of claim 1, wherein the protective cap layer has imperfections only with a diameter or length dimension less than 1 nm.

9. The apparatus of claim 1, wherein the protective cap layer has fewer than $10^4$ impurities.

10. The apparatus of claim 9, wherein the impurities include carbon, oxides, oxygen as a dissolved gas, sodium, or potassium.

11. The apparatus of claim 1, wherein the protective cap layer has a porosity less than or equal to 25%.

12. The apparatus of claim 1, wherein the protective cap layer has a packing density of greater than or equal to 0.92.

13. A method comprising:
    providing a silicon emitter having an exterior surface, wherein the silicon emitter has a diameter of 100 nm or less;
    applying a protective cap layer to the exterior surface of the silicon emitter, wherein the protective cap layer includes ruthenium.

14. The method of claim 13, wherein the applying includes sputter deposition.

15. The method of claim 13, wherein the applying includes atomic layer deposition.

16. The method of claim 13, wherein the applying includes ion sputtering.

17. A method comprising:
  providing a silicon emitter that includes a protective cap layer disposed on an exterior surface of the silicon emitter, wherein the silicon emitter has a diameter of 100 nm or less, and wherein the protective cap layer includes ruthenium;
  applying an electric field to the silicon emitter; and
  generating an electron beam from the silicon emitter.

18. The method of claim 17, wherein the silicon emitter operates in a vacuum of $10^{-9}$ Torr or less.

19. A system comprising:
  an electron beam source;
  a silicon emitter in the electron beam source, wherein the silicon emitter has a diameter of 100 nm or less;
  a protective cap layer disposed on an exterior surface of the silicon emitter, wherein the protective cap layer includes ruthenium; and
  a detector.

20. The system of claim 19, wherein the protective cap layer is free of pinholes in at least an emitting area.

* * * * *